(12) United States Patent
Cho et al.

(10) Patent No.: US 7,030,048 B2
(45) Date of Patent: Apr. 18, 2006

(54) THICK FILM DIELECTRIC COMPOSITIONS FOR USE ON ALUMINUM NITRIDE SUBSTRATES

(75) Inventors: Yong Cho, Cary, NC (US); Kenneth Warren Hang, Hillsborough, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 339 days.

(21) Appl. No.: 10/634,505

(22) Filed: Aug. 5, 2003

(65) Prior Publication Data

US 2005/0031837 A1   Feb. 10, 2005

(51) Int. Cl.
C03C 3/085 (2006.01)
C03C 3/062 (2006.01)
C03C 8/14 (2006.01)
C03V 4/16 (2006.01)

(52) U.S. Cl. .............. 501/69; 501/70; 501/73; 501/17; 501/18; 501/20; 501/32; 428/210; 428/426

(58) Field of Classification Search ............ 501/17, 501/18, 32, 69, 70, 73, 20; 428/210, 426
See application file for complete search history.

(56) References Cited

U.S. PATENT DOCUMENTS

| 4,808,673 | A | 2/1989 | Hang et al. |
| 4,830,988 | A | 5/1989 | Hang et al. |
| 5,089,172 | A | 2/1992 | Allison et al. |
| 5,165,986 | A | 11/1992 | Gardner et al. |
| 5,298,330 | A | 3/1994 | Stadnicar, Jr. et al. |
| 5,393,558 | A | 2/1995 | Allison et al. |
| 5,397,830 | A | 3/1995 | Shaikh et al. |
| 6,391,809 | B1 * | 5/2002 | Young .................... 501/57 |
| 2002/0030573 | A1 | 3/2002 | Mori et al. |

OTHER PUBLICATIONS

Thick film dielectrics on AlN (aluminum nitride) substrates, Dec. 2, 2002, pp 3-29.

* cited by examiner

Primary Examiner—Karl Group

(57) ABSTRACT present invention relates to a Cd-free and Pb-free glass composition comprising, based in mol %, 1–10% MO where M is selected from Ba, Sr, Ca and mixtures thereof, 5–30% MgO, 0.3–5% CuO, 0–2.5% $P_2O_5$, 0–2.5% $ZrO_2$, 24–45% ZnO, 2–10% $Al_2O_3$, 35–50% $SiO_2$ and 0.1–3% $A_2O$ where A is selected from the group of alkali elements and mixtures thereof wherein the glass composition is useful in thick paste dielectric materials which are compatible with AlN substrates.

7 Claims, No Drawings

THICK FILM DIELECTRIC COMPOSITIONS FOR USE ON ALUMINUM NITRIDE SUBSTRATES

FIELD OF THE INVENTION

The invention is directed to thick film dielectric compositions for use on aluminum nitride substrates to fabricate multilayer circuits for microelectronic applications.

BACKGROUND OF THE INVENTION

Recent hybrid packaging technologies concerning thick film materials have demanded a higher packing density, better performance and thermal management, and a lower cost. Aluminum nitride (AlN) substrates have been a promising candidate due to their excellent properties including high thermal conductivity (130–200 $Wm^{-1}K^{-1}$) and low thermal expansion coefficient (4–4.5 $ppmK^{-1}$) particularly for high power applications. This material is suitable for the direct attachment of low thermal expansion Si/GaAs-based chip carriers. Multilayer hybrid structures fabricated on AlN substrates provide an excellent solution for highly integrated ceramic packaging with good thermal management. The multilayer structures are achieved by designing electrical circuit patterns through multiple dielectric thick films printed and sequentially fired on AlN substrates.

Materials associated with aluminum nitride substrates for use in microelectronics have been described in some prior art. For example, U.S. Pat. No. 5,089,172 to Allison et al., discloses a thick film conductor composition adapted to be bonded to an aluminum nitride substrate. The conductor composition comprises a metal selected from Au, Cu, Ag, and Pt. Furthermore, the composition comprises from trace amounts up to about 10 wt. % PbO-containing glass frit binder and a Lithium compound.

U.S. Pat. No. 5,165,986 to Gardner et al., teaches a conductive composition comprising a Cu or Cu alloy, glass binder, and Cd or an oxide of Cd, which may be used on an AlN substrate. The glass taught in Gardner is $PbO—B_2O_3—SiO_2$.

U.S. Pat. No. 5,298,330 to Stadnicar, Jr. et al. teaches a thick film paste composition adapted to be bonded onto an aluminum nitride substrate. The composition requires an electrical property modifier and a glass composition comprising, based on wt. %, 27–56% $SiO_2$, 20–47.0% BaO, 4.5–25.0% $B_2O_3$, 0–18% PbO, 0–15% ZnO, and 3–14% $Al_2O_3$, at least trace amounts up to 3% $ZrO_2$, 0–8% MgO, and 0–12% CaO, among other compounds within specified ratios.

U.S. Pat. No. 4,808,673 to Hang et. al., teaches a dielectric ink composition including a glass composition, based on wt. %, comprising 15–25% ZnO, 10–25% MgO, 3–12% BaO or SrO, 5–20% $Al_2O_3$, 35–50% $SiO_2$, 0.5–3% $P_2O_5$ and 1–5% $ZrSiO_4$.

U.S. Pat. No. 4,830,988 to Hang et al., teaches a dielectric ink, for use on an alumina substrate, comprising glass frit, ceramic filler and organic vehicle.

U.S. Pat. No. 5,397,830 to Shaikh et al., teaches a thick film paste for use in producing a dielectric material comprising a glass composition and a vehicle. The glass composition requires both PbO and $Fe_2O_3$ additions to a $SiO_2—Al_2O_3—ZnO—MgO—BaO$ based dielectric composition.

The glass compositions utilized in the prior art contain elements, such as Pb and Cd, which are on the EPA hazardous waste list. Furthermore, some of the prior art compositions are not compatible with AlN substrates. A need therefore exists for AlN substrate-compatible thick film dielectric materials, which incorporate a Pb-free and Cd-free glass composition, to overcome the disadvantages of the prior art. An objective of this invention, therefore, is to provide new and improved dielectric materials which are compatible with AlN substrates. A further object is to provide a Pb-free and Cd-free glass composition for use in dielectric materials which are compatible with AlN substrates.

SUMMARY OF THE INVENTION

The glass composition of the present invention may be formulated into a thick film composition comprising a dispersion of finely divided solids comprising:
 (a) glass composition of the present invention; and
 (b) organic medium.

This thick film composition may further comprise ceramic filler.

Particular useful ceramic fillers are those selected from the group consisting of $Al_2O_3$, $ZrO_2$, $SiO_2$, $TiO_2$, $BaTiO_3$, cordierite, mullite and mixtures thereof.

The present invention also provides a method of forming a multilayer circuit comprising the steps:
 (a) providing an aluminum nitride substrate;
 (b) depositing a composition of the present invention on said substrate;
 (c) firing said composition and substrate forming an aluminum nitride article;
 (d) providing a metallic conductive composition;
 (e) depositing said conductive composition on said aluminum nitride article; and
 (f) firing said aluminum nitrate article and said conductive composition.

The present invention also provides a multilayer circuit made according to the method described immediately above. Also, an article comprising the thick film composition with or without filler being present, by processing the thick film composition to volatilize the organic polymeric binder and sinter the glass composition.

The present invention provides a multilayer circuit comprising a plurality of internal thick film metallic conductive composition layers separated by layers of the thick film composition with or without filler being present, wherein the thick film composition is processed to volatilize the organic polymeric binder and sinter the glass composition.

The multilayer circuit of the present invention, may contain a metallic conductive composition comprises Ag or containing Au.

The present invention provides a method of forming a green tape by casting a layer of one of the thick film composition of the present invention onto a flexible substrate and heating the cast layer to remove the volatile organic solvent therefrom.

A method of forming a green tape by casting a dispersion of a thin layer of a thick film composition of the present invention onto a flexible substrate, heating the cast layer to remove the volatile organic solvent therefrom and separating the solvent-free layer from the substrate.

The present invention provides a method of forming a multilayer interconnection comprising the steps of:
 (a) forming a patterned array of vias in a plurality of layers of green tape made by a process of the present invention;
 (b) filling said vias in the green tape layer(s) of step (a) with a thick film conductor composition;

(c) printing at least one patterned thick film functional layer over a surface of each of the via-filled green tape layers of step (b)'
(d) laminating the printed green tape layers of step (c) to form an assemblage comprising a plurality of interconnected functional layers separated by unfired green tape; and
(e) cofiring the assemblage of step (d).

The present invention provides a green tape and a multilayer interconnection made according to the methods described above.

DETAILED DESCRIPTION OF INVENTION

I. Glass

The present invention relates to a Cd-free and Pb-free glass composition comprising, based in mol %, 1–10% MO where M is selected from Ba, Sr, Ca and mixtures thereof, 5–30% MgO, 0.3–5% CuO, 0–2.5% $P_2O_5$, 0–2.5% $ZrO_2$, 24–45% ZnO, 2–10% $Al_2O_3$, 35–50% $SiO_2$ and 0.1–3% $A_2O$ where A is selected from the group of alkali elements and mixtures thereof wherein the glass composition is useful in thick paste dielectric materials which are compatible with AlN substrates.

Furthermore, the present invention relates to Cd-free and Pb-free glass composition(s) wherein the glass composition (s) are useful in thick paste dielectric materials which are compatible with AlN substrates. The alkali-containing zinc aluminosilicate glasses of this invention are novel and differ from common aluminosilicate glasses in that dielectrics prepared by the glass of the present invention, with or without a filler, have low TCE values (<5 ppmK$^{-1}$) and are compatible with AlN substrates. The components of the glass are based in mol %, 1–10% MO where M is selected from Ba, Sr, Ca and mixtures thereof, 5–30% MgO, 0.3–5% CuO, 24–45% ZnO, 0–2.5% $P_2O_5$, 0–2.5% $ZrO_2$, 2–10% $Al_2O_3$, 35–50% $SiO_2$ and 0.1–3% $A_2O$ where A is selected from the group of alkali elements, for example, Li, Na and K, and mixtures thereof.

The large contents of zinc and silicon in glass are believed to provide a low TCE value (<5 ppmK$^{-1}$). Other cations with +2 charges, such as Ba, Sr, Ca, Mg and Cu, in glass are effective in modifying glass structure and properties. In particular, the existence of alkali oxides improves sensitivity of the glass to heating condition by controlling the densification and crystallization behavior of the resulting tapes. The crucial role of the alkali addition is to provide required flow and densification characteristics to the resultant thick films at its desired firing temperature. It performs the function of glass viscosity adjustment without affecting required physical and electrical performance of the tape.

The glasses described herein are produced by conventional glass making techniques. More particularly, the glasses may be prepared as follows. Glasses were typically prepared in 500–2000 gram quantities. Typically, the ingredients are weighted then mixed in the desired proportions and heated in a bottom-loading furnace to form a melt in platinum alloy crucibles. Heating is typically conducted to a peak temperature (1400–1600° C.) and for a time such that the melt becomes entirely liquid and homogeneous. The glass melts are quenched by counter rotating stainless steel roller to form a 10–20 mil thick platelet of glass. The resulting glass platelet is then milled to form a powder with its 50% volume distribution set between 1–5 microns. The glass powders are then formulated with optional filler and organic medium into a thick film composition (or "paste").

The glass composition is present in the amount of about 43 to about 85 wt. %, based on total composition.

The glass described herein is also compatible with silver or gold-based conductors. The glass in the thick film does not flow excessively upon firing. There is no conductor staining problem with the glass after firing.

II. Dielectric Thick Film Composition and Application

The invention is further directed to the glass composition (as described above) incorporated in a thick film composition (sometimes referred to as "pastes") comprising a dispersion of finely divided solids comprising, based on solids: (a) 80–100 wt. % the glass composition; (b) 0–20 wt. % ceramic filler; both dispersed in a solution of (c) an organic polymeric binder; and (d) a volatile organic solvent. Furthermore, the thick film composition of the present invention provides glass and ceramic materials that are free of elements, such as Pb and Cd, which are on the EPA hazardous waste list. The components of the dielectric thick film composition are discussed herein above and below.

The main components of the thick film dielectric composition are (a) a glass powder dispersed in (b) an organic medium. A ceramic filler may be optionally added to modify the properties of the thick film composition. In most cases, glass is the main part of the dielectric, which determines its performance and compatibility with substrates and conductors. Primarily glass provides a low densification temperature below 900° C. and appropriate thermal and electrical properties. The glass of the present invention is described in Section I above. Ceramic filler may be used to modify the behavior of the glass for better compatibility with contacting substrates. There are two important parameters, which must be considered for the design of dielectric composition, thermal expansion match and chemical reactivity with AlN. The TCE mismatch between dielectric and AlN can induce cracking and other major failures in the circuitry. The reactivity of glass with AlN makes the glass choice more difficult because the substrate near the dielectric has a strong tendency to oxidation with oxide-based glasses in the dielectric. Some reaction with the surface of AlN is required to provide bonding of the dielectric layer, but excessive reaction with the nitride surface is known to produce adverse conditions such as blistering and loss of bonding. Additional constraints on the dielectric apply when a multilayer dielectric may be employed. Additional needs for compatibility with conductors and passive buried components adds to the complexity of the requirements.

Generally, a thick film composition comprises a functional phase that imparts appropriate electrically functional properties to the composition, which is dispersed in an organic medium. The functional phase comprises the functional solids dispersed in an organic medium, which act in the composition as a carrier for the functional phase. Furthermore, the thick film composition of the present invention may also comprise ceramic filler.

The thick film composition of the present invention is a screen-printable dielectric composition, which forms a multilayer structure on AlN substrates. The dielectric thick film composition, as described herein, may be bonded to an AlN substrate by depositing the thick film composition onto the substrate and firing the substrate. Furthermore, a multilayer circuit may be formed which utilizes the thick film composition of the present invention by providing a metallic conductor composition, including base metal conductors such as Ag or Au, to produce a functional electronic circuit on an AlN substrate. A multilayer circuit may be formed by the following method comprising the steps: (a) providing an Aluminum nitride substrate; (b) depositing the thick film composition as described herein on said substrate; (c) firing the composition and substrate forming an aluminum nitride article; (d) providing a metallic conductive composition; (e) depositing the conductive composition on the aluminum nitride article; and (f) firing the aluminum nitrate article and the conductive composition. The multilayer circuit may comprise a plurality of layers of interconnected electronic circuitry, each separated by the dielectric thick film composition of the present invention.

Ceramic Filler

Ceramic filler may also be added to the thick film composition of the present invention. Ceramic oxide filler such as $Al_2O_3$, $ZrO_2$, $SiO_2$, $TiO_2$, $BaTiO_2$, cordierite, mullite and mixtures thereof are typically added to the dielectric composition in an amount of 0–20 wt. % based on solids. The filler controls physical, thermal and electrical properties of the thick film over the given measurement condition. The glass and ceramic components of the composition form a glass-ceramic structure during firing by forming crystalline phases, which lead to a low TCE and a sufficient mechanical integrity.

$Al_2O_3$ is the chosen ceramic filler, since it may partially react with the glass to form an Al-containing crystalline phase or modify the sintering behavior. $Al_2O_3$ is very effective in providing high mechanical strength and inertness against detrimental chemical reactions. Another function of the ceramic filler is rheological control of the system during firing. The ceramic particles limit flow of the glass by acting as a physical barrier. They also inhibit sintering of the glass and thus facilitate better burnout of the organics. Other fillers, α quartz, $CaZrO_3$, mullite, cordierite, forsterite, zircon, zirconia, yttria or calcia-stabilized zirconia, $CaTiO_3$, $MgTiO_3$, $SiO_2$, and amorphous silica may be used by themselves or in mixtures to modify thick film performance and characteristics.

In the formulation of thick film compositions, the amount of glass relative to the amount of ceramic material is quite important. The ceramic filler range of 0–20% by wt. based on solids is considered preferable in that sufficient densification and good electrical performance are achieved. Typically, if the filler concentration exceeds 20% by wt., the fired structure is not sufficiently densified and too porous. In the case of alumina filler, the filler level of 1–5% by wt. based on solids is desirable in that full densification can be achieved at the firing temperature of 850° C. without creating blisters on the top surface of fired samples. The thick film composition may comprise up to 17 wt % ceramic filler based on total composition.

For the purpose of obtaining higher densification of the composition upon firing, it is important that the inorganic solids have small particle sizes. In particular, substantially none of the particles should exceed 15 μm and preferably not exceed 10 μm. Subject to these maximum size limitations, it is preferred that at least 50% of the particles, both glass and ceramic, be greater than 1 μm and preferably in the 2–5 μm range.

In addition to the filler, a coloring agent such as $Cu_2O$, Co-aluminate and CoO may be added for cosmetic effects when needed.

Organic Medium

The organic medium in which the glass and ceramic inorganic solids are dispersed is comprised of the polymeric binder which is dissolved in a volatile organic solvent and, optionally, other dissolved materials such as plasticizers, release agents, dispersing agents, stripping agents, antifoaming agents and wetting agents.

The solids are typically mixed with an organic medium by mechanical mixing to form a pastelike composition, called "pastes", having suitable consistency and rheology for printing. A wide variety of inert liquids can be used as organic medium. The organic medium must be one in which the solids are dispersible with an adequate degree of stability. The rheological properties of the medium must be such that they lend good application properties to the composition. Such properties include: dispersion of solids with an adequate degree of stability, good application of composition, appropriate viscosity, thixotropic, appropriate wettability of the substrate and the solids, a good drying rate, good firing properties, and a dried film strength sufficient to withstand rough handling. The organic medium is conventional in the art and is typically a solution of the polymer in solvent(s). The most frequently used resin for this purpose is ethyl cellulose. Other examples of resins include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. The preferred mediums are based on ethyl cellulose and β-terpineol. Various combinations of these and other solvents are formulated to obtain the viscosity and volatility requirements desired.

The ratio of organic medium in the thick film composition to the inorganic solids in the dispersion is dependent on the method of applying the paste and the kind of organic medium used, and it can vary. Usually, the dispersion will contain 60–85 wt % of inorganic solids and 15–40 wt % of organic medium in order to obtain good coating. Within these limits, it is desirable to use the least possible amount of binder vis-à-vis solids in order to reduce the amount of organics which must be removed by pyrolysis and to obtain better particle packing which gives reduced shrinkage upon firing.

The thick film composition is fired to burn out the organics and to impart the electrically functional properties. The glass based dielectric thick film paste is also suitable for firing in inert or oxidizing atmosphere. The resultant multilayer thick film dielectrics, after firing, demonstrate good densification and compatibility with silver and gold metallizations.

Prior to firing, a processing requirement may include an optional heat treatment such as drying, curing, reflow, soldering and others known to those skilled in the art of thick film technology. "Organics" comprise polymer or resin components of a thick film composition.

III. Green Tape Composition and Applications

The thick film composition can be used to fabricate ceramic tape substrates for applications utilizing LTCC (low temperature co-fired ceramics) technology. When used in this application it may be termed "green tape." The LTCC tape consists of glass and ceramic filler (and organic medium prior to firing). The glass from above is one component of the composition. A proper choice of ceramic filler is required to produce good dimensional stability and high mechanical strength. Ceramic filler such as those listed above may also be used in green tape applications. A desirable range of glass/filler ratios is determined depending on the properties desired in the fired specimens. A filler range of 20–60% by weight solids is considered desirable in that sufficient densification is achieved. If the filler concentration exceeds 60% by wt., the fired structure is not sufficiently densified and is too porous.

A green tape is formed by casting a thin layer of a slurry dispersion of the glass, polymeric binder and solvent as described above onto a flexible substrate, heating the cast layer to remove the volatile solvent and then separating the solvent-free layer from the substrate. The green tape is used primarily as a dielectric or insulating material for multilayer electronic circuits. A roll of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize the green tape. Typical via hole sizes range from 0.006" to 0.25". The interconnections between layers are formed by filling the via holes with a thick film conductive ink (composition). This ink is usually applied by standard screen printing techniques. Each layer of circuitry is completed by screen printing conductor tracks. Also, resistor inks or high dielectric capacitor inks can be printed on each layer to form resistive or capacitive circuit elements. Also, especially formulated high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing is carried out in a standard thick film conveyor belt furnace or in a box furnace with a programmed heating cycle forming a fired article.

As used herein, the term "firing" means heating the article in an oxidizing atmosphere such as air to a temperature and for a time sufficient to volatilize (burn-out) the organic material in the layers of the assemblage to sinter any glass, metal or dielectric material in the layers and thus densify the dielectric layer.

It will be recognized by those skilled in the art that in each of the laminating steps the layers must be accurate in registration so that the vias are properly connected to the appropriate contact points of the adjacent functional layer.

The term "functional layer" refers to the layers printed on the ceramic green tape which have either conductive, resistive or capacitive functionality. Thus, as indicated above, a typical green tape layer may have printed thereon one or more resistor circuits and/or capacitors as well as a conductive circuit.

The present invention will be discussed in further detail by giving practical examples. The scope of the present invention, however, is not limited in any way by these practical examples.

EXAMPLES

Examples 1–12

A series of alkali-containing zinc aluminosilicate glass compositions that have been found to be suitable in the present invention for application to thick film paste are shown in Table 1. All glasses were prepared by mixing raw materials and then firing in a platinum crucible at 1450–1550° C. The resulting melt was stirred and quenched by pouring on the surface of counter rotating stainless steel rollers or into a water tank. The glass powders prepared for the invention were adjusted to a 1–3 μm mean size by wet milling using alumina ball media prior to formulation as a paste. The wet slurry after milling was dried in a hot air oven and deagglomerated by the sieving process.

The glass density has been measured by the Archemedes method utilizing the volume displacement when a glass sample is weighed while suspended in water and dried to compute its density in grams per cubic centimeter.

The glass was further characterized by DTA (Differential Thermal Analysis) to investigate crystallization behavior during firing. DTA has been used frequently in demonstrating crystallization behavior of certain glasses with regard to crystallization temperature and crystallization kinetics. As a result, two distinct exothermic peaks at about 820° C. and 970° C. were found in the DTA output plots of the tested glass examples 6–10, suggesting the occurrence of crystallization from the glassy state. The crystalline phase is believed to be based on zinc magnesium silicates. The crystallization behavior is an important characteristic of the glass composition for this application and can be attributed to physical property benefits, such as high mechanical strength and good dimensional control of the dielectrics, which are known to be particularly important in multilayer dielectrics.

TABLE 1

| | Glass composition in mol % | | | | | | | | | | | |
|---|---|---|---|---|---|---|---|---|---|---|---|---|
| | Ex. # | | | | | | | | | | | |
| | 1 | 2 | 3 | 4 | 5 | 6 | 7 | 8 | 9 | 10 | 11 | 12 |
| $SiO_2$ | 41.1 | 40.2 | 40.4 | 41.3 | 37.2 | 42.4 | 42.3 | 44.8 | 42.4 | 42.4 | 42.4 | 42.4 |
| $Al_2O_3$ | 5.7 | 5.8 | 5.9 | 5.7 | 2.8 | 5.7 | 5.6 | 4 | 5.7 | 5.7 | 5.7 | 5.7 |
| ZnO | 30.8 | 30.6 | 30.6 | 30.7 | 43.2 | 30.4 | 30.4 | 30 | 24.1 | 30.5 | 30.5 | 30.5 |
| MgO | 17.9 | 18 | 17.8 | 17.8 | 8.8 | 17.7 | 17.6 | 17.4 | 24.1 | 17.7 | 17.7 | 17.7 |
| CuO | 0.9 | 0.9 | 0.9 | 0.9 | 3.9 | 0.9 | 1.4 | 0.8 | 0.8 | 0.8 | 0.8 | 0.8 |
| BaO | 2.5 | 2.5 | 2.4 | 2.5 | 1.2 | 2.4 | 2.4 | 2.4 | 2.4 | | | 2.4 |
| SrO | | | | | | | | | | 2.4 | | |
| CaO | | | | | | | | | | | 2.4 | |
| $Na_2O$ | 0.6 | 0.6 | 0.6 | 0.6 | 2.9 | 0.5 | 0.3 | 0.6 | 0.5 | 0.5 | 0.5 | |
| $K_2O$ | | | | | | | | | | | | 0.5 |
| $P_2O_5$ | 0.7 | 1.2 | 0.5 | 0.2 | | | | | | | | |
| $ZrO_2$ | | | 1.1 | 0.4 | | | | | | | | |
| Density (g/cc) | — | — | — | — | 3.68 | 3.36 | 3.41 | 3.38 | 3.45 | 3.37 | 3.33 | 3.36 |

Examples 13–23

Dielectric thick film paste was prepared by mixing glass and ceramic filler with organic media based on the mixture of Texanol® solvent and ethyl cellulose resin. In addition, coloring agent such as co-aluminate and cobalt oxide was used to have cosmetic effects. Table 2 represents the examples of thick film compositions. The dielectric paste was printed on an AlN substrate, dried at 120° C. for solvent evaporation, and then fired at a peak temperature of 850° C. for 10 minute in a conventional profile of 30 or 60 minutes. The ceramic fired dense and showed good adhesion with AlN substrate. No cracking or blistering was observed on the surface of fired thick films.

The fired thick films were further characterized using various patterns of commercially-available DuPont conductors such as ALN11 (Ag), ALN21 (Ag—Pt), ALN33(Ag—Pd), and 5771 (Au). The conductors were screen-printed on the top or bottom of the dielectric and fired separately at the same heating profile (30 minutes) and peak temperature (850° C.). All conductors showed good compatibility with the dielectric thick film. No silver stains or cracks were particularly observed around the pattern of Ag-based conductors.

Table 3 shows the electrical performance of selected samples of Examples 13–23. Low frequency dielectric characteristics were evaluated using an impedance analyzer (Hewlett Packard 4284A) within the frequency range of 1 kHz to 13 MHz. For the dielectric property testing, a capacitor thick film structure sandwiched by a Ag-based conductor was fabricated and measured at room temperature with a change in frequency. Resulting dielectric constant ranged from 5 to 7 at 1 MHz. No significant variations in the dielectric constant and loss tangent were observed over the frequency range and thick film composition. Values in breakdown voltage and electrical resistance showed excellence regardless of sample composition. Breakdown voltage was measured using an AC/DC HIPOT tester (Model HD115/A) by increasing applied voltage for the same samples used for dielectric property measurement. A HP3457A multimeter was used for the measurement of electrical resistance.

Specifically, the Examples 15–17 demonstrate the effect of different contents of alumina filler on thick film performance. Increasing the content of ceramic filler tends to generate channels for easy burn-out of the organics during firing and result in blister-free thick films. But excessive amounts of alumina filler showed an increase in dielectric loss due presumably to the decreased hermeticity of thick films.

TABLE 2

Solids composition in weight %

| | Ex. # | | | | | | | | | | |
|---|---|---|---|---|---|---|---|---|---|---|---|
| | 13 | 14 | 15 | 16 | 17 | 18 | 19 | 20 | 21 | 22 | 23 |
| Glass Ex. # | 1 | 2 | 6 | 6 | 6 | 6 | 6 | 7 | 8 | 9 | 10 |
| Glass | 71.0% | 71.0% | 71.0% | 68.0% | 65.0% | 71.0% | 71.0% | 71.0% | 71.0% | 71.0% | 71.0% |
| $Al_2O_3$ | 1.5% | 1.5% | 1.5% | 4.5% | 7.5% | — | — | 1.5% | 1.5% | 1.5% | 1.5% |
| $ZrO_2$ | — | — | — | — | — | 1.5% | — | — | — | — | — |
| Cordierite | — | — | — | — | — | — | 1.5% | — | — | — | — |
| Co-aluminate | 1.5% | 1.5% | 1.5% | 1.5% | 1.5% | 1.5% | 1.5% | 1.5% | 1.5% | 1.5% | 1.5% |
| Surfactant | 0.7% | 0.7% | 0.7% | 0.7% | 0.7% | 0.7% | 0.7% | 0.7% | 0.7% | 0.7% | 0.7% |
| Binder Resin | 1.3% | 1.3% | 1.3% | 1.3% | 1.3% | 1.3% | 1.3% | 1.3% | 1.3% | 1.3% | 1.3% |
| Solvent | 24.0% | 24.0% | 24.0% | 24.0% | 24.0% | 24.0% | 24.0% | 24.0% | 24.0% | 24.0% | 24.0% |

TABLE 3

Characteristics of thick films

| Ex. # | 13 | 14 | 15 | 16 | 17 | 18 | 19 | 20 | 21 | 22 | 23 |
|---|---|---|---|---|---|---|---|---|---|---|---|
| Dielectric Constant (at 1 MHz) | 5.7 | 5.9 | 5.8 | 5.9 | 6.2 | 6.1 | — | 6.1 | 5.9 | — | 5.9 |
| Loss tangent (at 1 MHz) | <0.3% | <0.3% | <0.3% | <0.3% | <0.5% | <0.3% | <0.3% | <0.3% | <0.3% | <0.3% | <0.3% |
| Insulation resistance Ω (at 100 V DC) | >$10^{12}$ | >$10^{12}$ | >$10^{12}$ | >$10^{12}$ | >$10^{12}$ | >$10^{12}$ | >$10^{12}$ | >$10^{12}$ | >$10^{12}$ | >$10^{12}$ | >$10^{12}$ |
| Breakdown Voltage, V/25 μm | >1000 | >1000 | >1000 | >1000 | >1000 | >1000 | >1000 | >1000 | >1000 | >1000 | >1000 |

What is claimed is:

1. A glass composition comprising, in mol %, 1–10% MO where M is selected from Ba, Sr, Ca and mixtures thereof, 5–30% MgO, 0.3–5% CuO, 0–2.5% $P_2O_5$, 0–2.5% $ZrO_2$, 24–45% ZnO, 2–10% $Al_2O_3$, 35–50% $SiO_2$ and 0.1–3% $A_2O$ where A is one or more alkali metal elements.

2. A thick film composition comprising a dispersion of finely divided solids comprising:
   (a) glass composition as in claim 1; and
   (b) organic medium.

3. The thick film composition of claim 2 further comprising ceramic filler.

4. The thick film composition of claim 3 wherein said ceramic filler comprises up to 17 wt. % of the total composition.

5. The thick film composition as in any one of claim 2, 3, or 4, wherein said glass composition comprises 43–85 wt. % of the total composition.

6. The thick film composition as in any one of claim 2, 3, or 4, wherein said organic medium comprises 15–40 wt. % of the total composition.

7. The thick film composition of claim 2 wherein the ceramic filler is selected from $Al_2O_3$, $ZrO_2$, $SiO_2$, $TiO_2$, $BaTiO_3$, cordierite, mullite, and mixtures thereof.

* * * * *

UNITED STATES PATENT AND TRADEMARK OFFICE
CERTIFICATE OF CORRECTION

| | |
|---|---|
| PATENT NO. | : 7,030,048 B2 |
| APPLICATION NO. | : 10/634505 |
| DATED | : April 18, 2006 |
| INVENTOR(S) | : Cho Yong and Hang Kenneth Warren |

It is certified that error appears in the above-identified patent and that said Letters Patent is hereby corrected as shown below:

Title Page, Item (57) "ABSTRACT", please insert the word --The-- at the beginning of the first sentence.

Signed and Sealed this

Sixth Day of March, 2007

JON W. DUDAS
*Director of the United States Patent and Trademark Office*